(12) United States Patent
Poon et al.

(10) Patent No.: US 8,054,448 B2
(45) Date of Patent: Nov. 8, 2011

(54) APPARATUS AND METHOD FOR PROVIDING FLUID FOR IMMERSION LITHOGRAPHY

(75) Inventors: Alex Ka Tim Poon, San Ramon, CA (US); Leonard Wai Fung Kho, San Francisco, CA (US)

(73) Assignee: Nikon Corporation, Tokyo (JP)

( * ) Notice: Subject to any disclaimer, the term of this patent is extended or adjusted under 35 U.S.C. 154(b) by 671 days.

(21) Appl. No.: 11/579,442

(22) PCT Filed: Apr. 27, 2005

(86) PCT No.: PCT/US2005/014200
§ 371 (c)(1),
(2), (4) Date: Nov. 2, 2006

(87) PCT Pub. No.: WO2005/111722
PCT Pub. Date: Nov. 24, 2005

(65) Prior Publication Data
US 2007/0222967 A1 Sep. 27, 2007

Related U.S. Application Data

(63) Continuation-in-part of application No. PCT/US2004/022915, filed on Jul. 16, 2004.

(60) Provisional application No. 60/568,345, filed on May 4, 2004, provisional application No. 60/623,170, filed on Oct. 29, 2004, provisional application No. 60/623,172, filed on Oct. 29, 2004.

(51) Int. Cl.
*G03B 27/42* (2006.01)

(52) U.S. Cl. .......................................... 355/53; 355/30

(58) Field of Classification Search .................... 355/30, 355/53
See application file for complete search history.

(56) References Cited

U.S. PATENT DOCUMENTS

| | | |
|---|---|---|
| 3,648,587 A | 3/1972 | Stevens |
| 4,346,164 A | 8/1982 | Tabarelli et al. |
| 4,480,910 A | 11/1984 | Takanashi et al. |
| 4,509,852 A | 4/1985 | Tabarelli et al. |
| 5,610,683 A | 3/1997 | Takahashi |
| 5,715,039 A | 2/1998 | Fukuda et al. |
| 5,825,043 A | 10/1998 | Suwa |
| 6,262,796 B1 | 7/2001 | Loopstra et al. |
| 6,341,007 B1 | 1/2002 | Nishi et al. |

(Continued)

FOREIGN PATENT DOCUMENTS

CN 1501173 A 6/2004

(Continued)

OTHER PUBLICATIONS

English translation of WO 9949504 A1 is attached.*

(Continued)

*Primary Examiner* — Edward Glick
*Assistant Examiner* — Mesfin T Asfaw
(74) *Attorney, Agent, or Firm* — Oliff & Berridge, PLC

(57) ABSTRACT

An apparatus and method are disclosed for providing fluid for immersion lithography. Immersion fluid is injected into an inner cavity in a direction that is different than a direction in which the nozzle moves. The immersion fluid can also be injected at different rates into the inner cavity at different sides. A wafer substrate is then exposed by light through the immersion fluid.

56 Claims, 10 Drawing Sheets

U.S. PATENT DOCUMENTS

| | | |
|---|---|---|
| 7,053,983 B2 | 5/2006 | Tokita |
| 7,292,313 B2 | 11/2007 | Poon et al. |
| 7,367,345 B1 | 5/2008 | Hemker et al. |
| 7,388,648 B2 | 6/2008 | Lof et al. |
| 7,576,833 B2 | 8/2009 | Poon et al. |
| 2002/0163629 A1 | 11/2002 | Switkes et al. |
| 2002/0191166 A1* | 12/2002 | Hasegawa et al. ............... 355/53 |
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0060195 A1* | 4/2004 | Garcia et al. ..................... 34/445 |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0182422 A1 | 9/2004 | Boyd et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1* | 1/2005 | Cox et al. ......................... 355/30 |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0168713 A1 | 8/2005 | Vogel et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Zaal et al. |
| 2005/0225737 A1 | 10/2005 | Weissenrider et al. |
| 2005/0231694 A1 | 10/2005 | Kolesnychenko et al. |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259234 A1 | 11/2005 | Hirukawa et al. |
| 2005/0264778 A1 | 12/2005 | Lof et al. |
| 2005/0270505 A1 | 12/2005 | Smith |
| 2005/0280791 A1 | 12/2005 | Nagasaka et al. |
| 2005/0282405 A1 | 12/2005 | Harpham et al. |
| 2006/0023183 A1 | 2/2006 | Novak et al. |
| 2006/0023188 A1 | 2/2006 | Hara |
| 2006/0038968 A1 | 2/2006 | Kemper et al. |
| 2006/0061739 A1* | 3/2006 | Hoogendam et al. ........... 355/30 |
| 2006/0087630 A1 | 4/2006 | Kemper et al. |
| 2006/0119818 A1 | 6/2006 | Nagasaka |
| 2006/0139593 A1 | 6/2006 | Nagasaka et al. |
| 2006/0152697 A1 | 7/2006 | Poon et al. |
| 2006/0158627 A1 | 7/2006 | Kemper et al. |
| 2006/0176456 A1 | 8/2006 | Nagasaka et al. |
| 2006/0209278 A1 | 9/2006 | Kiuchi et al. |
| 2006/0209414 A1 | 9/2006 | Van Santen et al. |
| 2006/0261288 A1 | 11/2006 | Van Santen |
| 2007/0110213 A1 | 5/2007 | Leenders et al. |
| 2007/0222967 A1 | 9/2007 | Poon et al. |
| 2008/0291409 A1 | 11/2008 | Nakano |
| 2009/0002648 A1 | 1/2009 | Poon et al. |

FOREIGN PATENT DOCUMENTS

| | | |
|---|---|---|
| DE | 221 563 A1 | 4/1985 |
| DE | 224 448 A1 | 7/1985 |
| EP | 0 605 103 A1 | 7/1994 |
| EP | 1 420 298 A2 | 5/2004 |
| EP | 1 489 462 A2 | 6/2004 |
| EP | 1 477 856 A1 | 11/2004 |
| EP | 1 486 827 A2 | 12/2004 |
| EP | 1 571 697 A1 | 9/2005 |
| EP | 1 598 855 A1 | 11/2005 |
| EP | 1 612 850 A1 | 1/2006 |
| EP | 1 646 074 A1 | 4/2006 |
| EP | 1 646 075 A1 | 4/2006 |
| EP | 1 662 554 A1 | 5/2006 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A-6-124873 | 5/1994 |
| JP | A-7-220990 | 8/1995 |
| JP | A-8-316125 | 11/1996 |
| JP | A-10-303114 | 11/1998 |
| JP | A-10-340846 | 12/1998 |
| JP | A-11-176727 | 7/1999 |
| JP | A-2000-58436 | 2/2000 |
| JP | A-2004-289126 | 10/2004 |
| JP | A-2004-320016 | 11/2004 |
| JP | A-2004-349645 | 12/2004 |
| JP | A-2005-12228 | 1/2005 |
| JP | A-2005-19864 | 1/2005 |

| | | |
|---|---|---|
| JP | A-2005-045082 | 2/2005 |
| JP | A-2005-045223 | 2/2005 |
| JP | A-2005-045232 | 2/2005 |
| JP | A-2005-109426 | 4/2005 |
| JP | A-2006-510146 | 3/2006 |
| JP | A-2006-511021 | 3/2006 |
| JP | A-2006-523029 | 10/2006 |
| JP | A-2007-525007 | 8/2007 |
| TW | 200502719 A | 1/2005 |
| WO | WO 99/49504 | 9/1999 |
| WO | WO 9949504 A1 * | 9/1999 |
| WO | WO 00/20940 | 4/2000 |
| WO | WO 02/091078 A1 | 11/2002 |
| WO | WO 03/077037 A1 | 9/2003 |
| WO | WO 2004/019128 A2 | 3/2004 |
| WO | WO 2004/053955 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/086468 A1 | 10/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/090956 A1 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/006418 A1 | 1/2005 |
| WO | WO 2005/008339 A2 | 1/2005 |
| WO | WO-A-2005/006415 | 1/2005 |
| WO | WO-A-2005/006417 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO-A-2005/020299 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Jan. 22, 2008 Office Action in corresponding European Application.

Emerging Lithographic Technologies VI, Proceedings of SPIE, vol. 4688 (2002), "Semiconductor Foundry, Lithography, and Partners", B.J. Lin, pp. 11-24.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, 3rd 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).

Nikon Corporation, NGL Workshop, Jul. 10, 2003, "Potential performance and feasibility of immersion lithography", Soichi Owa et al., 33 pages, slides 1-33.

Optical Microlithography XV, Proceedings of SPIE, vol. 4691 (2002), "Resolution Enhancement of 157 nm Lithography by Liquid Immersion", M. Switkes et al., pp. 459-465.

Optical Microlithography XVI, Proceedings of SPIE vol. 5040 (2003), "Immersion lithography; its potential performance and issues", Soichi Owa et al., pp. 724-733.

Refraction Technologies Corp. Product Literature: Porous Ceramics and Specifications, www.refractron.com/display/default.aspx?CategoryID=22.

Oct. 11, 2006 Office Action in U.S. Appl. No. 11/362,833.

Jun. 22, 2007 Notice of Allowance in U.S. Appl. No. 11/362,833.

Feb. 5, 2009 Office Action in U.S. Appl. No. 11/790,233.

Aug. 27, 2010 Office Action in U.S. Appl. No. 12/461,243.

Apr. 7, 2009 Notice of Allowance in U.S. Appl. No. 11/987,778.

Sep. 17, 2008 Office Action in U.S. Appl. No. 11/987,778.

Jul. 22, 2008 Office Action in Japanese Application No. 2006-525323, with translation.

Mar. 3, 2009 Office Action in Japanese Application No. 2006-525323, with translation.

Apr. 27, 2007 Office Action in Chinese Application No. 2004800238885, with translation.

Feb. 1, 2008 Office Action in Chinese Application No. 2004800238885, with translation.

Feb. 24, 2010 Office Action in Chinese Application No. 200810092257.9, with translation.

Aug. 15, 2005 Written Opinion in International Application No. PCT/US04/22915.

Mar. 20, 2006 Written Opinion in International Application No. PCT/US2005/014200.

Sep. 15, 2008 Supplemental European Search Report in European Application No. 04778426.9.

Aug. 15, 2005 International Search Report in International Application No. PCT/US04/22915.

Mar. 20, 2006 International Search Report in International Application No. PCT/US2005/014200.

May 12, 2011 Office Action in U.S. Appl. No. 12/461,243.

Jun. 14, 2011 Office Action issued in JP Application No. 2008-242895 (with English translation).

Jun. 15, 2011 Office Action issued in TW Application No. 093126654 (with English translation).

* cited by examiner

APPARATUS AND METHOD FOR PROVIDING FLUID FOR IMMERSION LITHOGRAPHY

RELATED APPLICATIONS

This application claims priority to U.S. Provisional Application No. 60/568,345, entitled "APPARATUS AND METHOD FOR PROVIDING FLUID FOR IMMERSION LITHOGRAPHY," filed on May 4, 2004, and PCT Application No. PCT/US04/22915, entitled "APPARATUS AND METHOD FOR PROVIDING FLUID FOR IMMERSION LITHOGRAPHY," filed on Jul. 16, 2004, which are hereby incorporated herein by reference. This application also claims priority to U.S. Provisional Patent Application Nos. 60/623,170 and 60/623,172, both of which were filed Oct. 29, 2004, and which are hereby incorporated herein by reference in their entirety.

FIELD

This invention relates generally to immersion lithography and, more particularly, to an apparatus and a method for providing fluid for immersion lithography. Specifically, this invention relates to improving fluid flow during immersion lithography.

BACKGROUND

An exposure apparatus is one type of precision assembly that is commonly used to transfer images from a reticle onto a semiconductor wafer during semiconductor processing. A typical exposure apparatus includes an illumination source, a reticle stage assembly that retains a reticle, an optical assembly, a wafer stage assembly that retains a semiconductor wafer, a measurement system, and a control system. The resist coated wafer is placed in the path of the radiation emanating from a patterned mask and exposed by the radiation. When the resist is developed, the mask pattern is transferred onto the wafer. In microscopy, extreme ultra violet (EUV) radiation is transmitted through a thin specimen to a resist covered plate. When the resist is developed, a topographic shape relating to the specimen structure is left.

Immersion lithography is a technique which can enhance the resolution of projection lithography by permitting exposures with numerical aperture (NA) greater than one, which is the theoretical maximum for conventional "dry" systems. By filling the space between the final optical element and the resist-coated target (i.e., wafer), immersion lithography permits exposure with light that would otherwise be totally internally reflected at an optic-air interface. Numerical apertures as high as the index of the immersion liquid (or of the resist or lens material, whichever is least) are possible. Liquid immersion also increases the wafer depth of focus, i.e., the tolerable error in the vertical position of the wafer, by the index of the immersion liquid compared to a dry system with the same numerical aperture.

Immersion lithography thus has the potential to provide resolution enhancement equivalent to the shift from 248 to 193 nm. Unlike a shift in the exposure wavelength, however, the adoption of immersion would not require the development of new light sources, optical materials, or coatings, and should allow the use of the same or similar resists as conventional lithography at the same wavelength. In an immersion system where the final optical element and the wafer (and perhaps the stage as well) are in contact with the immersion fluid, much of the technology and design developed for conventional tools in areas such as contamination control, carry over directly to immersion lithography.

One of the challenges of immersion lithography is to design a system for delivery and recovery of an immersion fluid, such as water, between the final optical element and the wafer, so as to provide a stable condition for immersion lithography.

For example, injecting immersion fluid under an optical element that is inconsistent or non-uniform throughout the immersion area can adversely affect the lithography process. In addition, as immersion fluid moves in and out of the immersion area, air can be trapped under the optical element that can also affect the lithography process. Furthermore, residue immersion fluid left over in the immersion area from a previous immersion process can raise the temperature of the immersion fluid under the optical element. That is, immersion fluid left over from a previous process, which has been exposed to light again, can raise the temperature of the immersion fluid in a subsequent process under the optical element. This can adversely affect the wafer and lithography process. Therefore, what is needed is improved immersion lithography techniques for the flow and removal of immersion fluid.

SUMMARY

According to certain embodiments, a method for immersion lithography includes injecting immersion fluid into an inner cavity in a direction that is different than a direction in which the nozzle moves; and exposing light through the immersion fluid onto a wafer substrate covered with photoresist.

According to certain embodiments, a nozzle for immersion lithography includes an inner cavity and an immersion fluid input. The inner cavity holds immersion fluid. The immersion fluid input injects immersion fluid into the inner cavity in a direction that is different than a direction in which a wafer substrate moves.

According to certain embodiments, a method for immersion lithography includes injecting immersion fluid at a first rate; injecting immersion fluid at a second rate, the second rate being different than the first rate; and exposing light through the immersion fluid onto a wafer substrate covered with photoresist.

According to certain embodiments, a nozzle for immersion lithography includes an inner cavity, a first input, and a second input. The inner cavity holds immersion fluid. The first input injects immersion fluid at a first rate. The second input injects immersion fluid at a second rate. The second rate is different than the first rate.

According to certain embodiments, a method for immersion lithography includes injecting immersion fluid into an inner cavity at a first side and a second side in a direction that is different than a direction in which a wafer substrate moves, the immersion fluid being injected from the first side having a flow rate that is different from the immersion fluid being injected from the second side; and exposing light through the immersion fluid onto a wafer substrate covered with photoresist.

According to certain embodiments, an apparatus includes an inner cavity, a first input, and a second input. The inner cavity holds immersion fluid. The first input is at a first side of the inner cavity and injects immersion fluid into the inner cavity at a first direction and a first rate. The second input is at a second side of the inner cavity and injects immersion fluid into the inner cavity at a second direction and a second rate.

The first rate is different than the second rate, and the first and second directions are different than a scanning axis direction.

DRAWINGS

DESCRIPTION

Reference will now be made in detail to exemplary implementations and examples of the invention, examples of which are illustrated in the accompanying drawings. Wherever possible, the same reference numbers will be used throughout the drawings to refer to the same or like parts.

Figure 1:
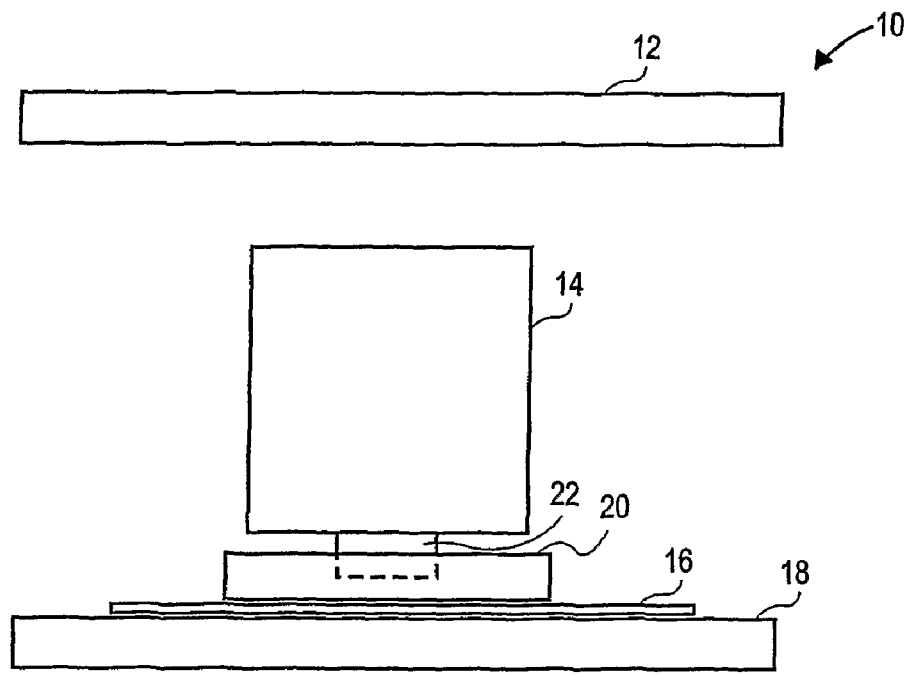
FIG. 1 is a simplified elevational view schematically illustrating an immersion lithography system, according to certain embodiments.

FIG. 1 shows an immersion lithography system 10 including a reticle stage 12 on which a reticle is supported, a projection lens 14, and a wafer 16 supported on a wafer stage 18. An immersion apparatus 20, which is sometimes referred to herein as a nozzle, is disposed around the final optical element 22 of the projection lens 14 to provide and recover an immersion fluid, which may be a liquid such as water or oil, between the final optical element 22 and the wafer 16. In this example, the immersion lithography system 10 is a scanning exposure system in which the reticle and the wafer 16 are moved synchronously in respective scanning directions during a scanning exposure.

Figure 3:
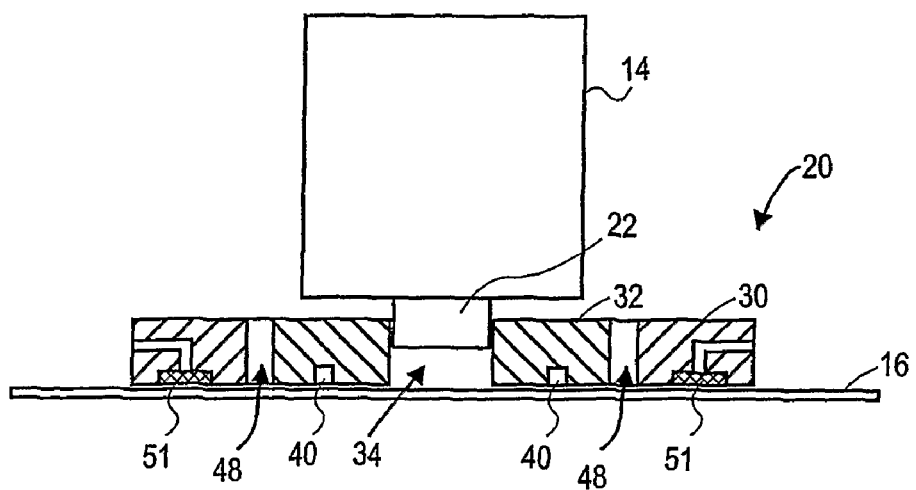
FIG. 3 is a simplified cross-sectional view of the nozzle of FIG. 2, according to certain embodiments.
Figure 2:
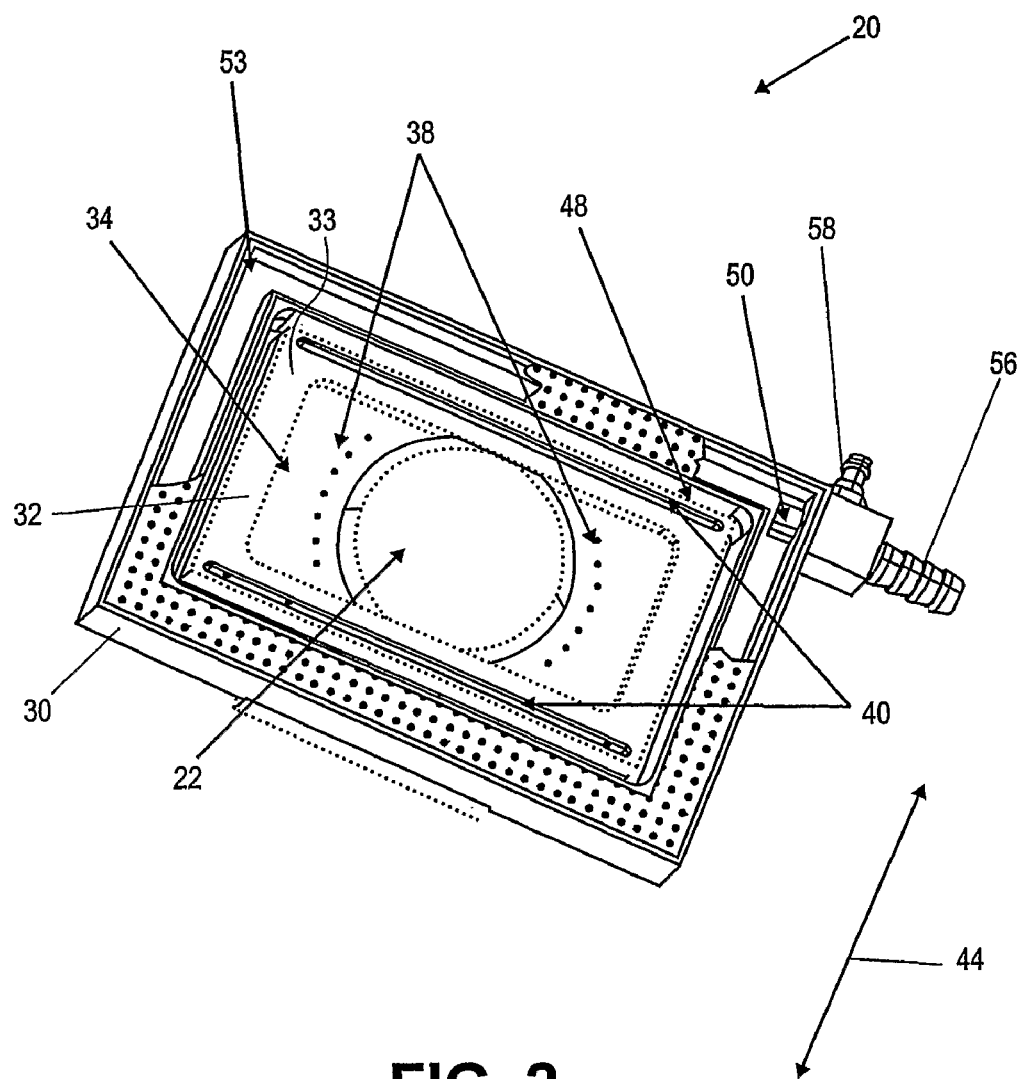
FIG. 2 is a perspective view of a nozzle for fluid delivery and recovery for immersion lithography, according to certain embodiments.
Figure 4:
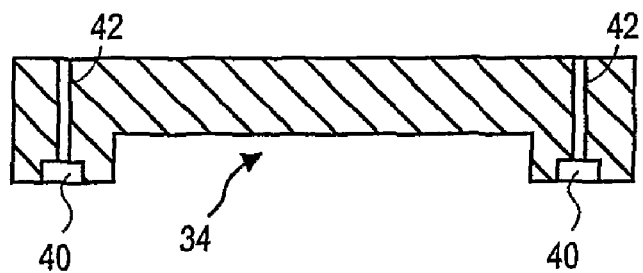
FIG. 4 is a cross-sectional view of the inner part of the nozzle of FIG. 2, according to certain embodiments.

FIGS. 2 and 3 show the apparatus or nozzle 20 for delivery and recovery of the fluid between the final optical element 22 and the wafer 16 for immersion lithography. FIG. 2 shows the bottom perspective view of the nozzle 20, which includes an outer part 30 and an inner part 32. The inner part 32 defines an inner cavity 34 to receive the fluid between the final optical element 22 and the wafer 16. The inner part 32 includes apertures 38 for fluid flow into and out of the inner cavity 34. For example, in certain embodiments, the apertures 38 can act as an immersion fluid input into the inner cavity 34. As seen in FIG. 3, there are apertures 38 disposed on both sides of the final optical element 22 in a direction intersecting with the scanning direction. The inner part 32 has a flat portion 33 surrounding the inner cavity 34. The flat portion 33 is substantially parallel to the wafer 16. The distance D1 between the end surface of the final optical element 22 and the wafer 16 is greater than the distance D2 between the flat portion 33 and the wafer 16. The distance D1 can be 1.0-5.0 mm, and the distance D2 could be 0.5-2.0 mm. In certain embodiments, the distance D1 is substantially equal to the distance D2. The inner part 32 further includes a pair of buffers or buffer slots 40 with purge holes 42. The buffers 40 are arranged at or near the flat portion 33. The buffers 40 are disposed on opposite sides of the final optical element 22 in the scanning direction. A cross-sectional view of the inner part 32 in the direction of scan 44 is illustrated in FIG. 4.

Figure 5:
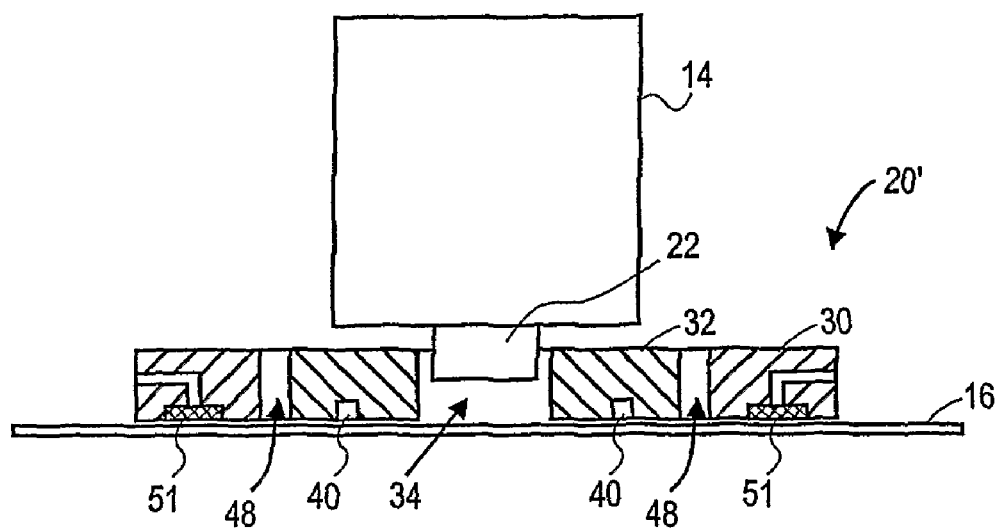
FIG. 5 is a simplified cross-sectional view of the nozzle, according to certain embodiments.

The outer part 30 is spaced from the inner part 32 by an intermediate spacing or groove 48. In certain embodiments, the outer part 30 can include one fluid recovery opening 50 disposed on a side of the final optical element 22. In certain embodiments, the fluid recovery openings 50 are disposed on opposite sides of the final optical element 22. A porous member 51 can be disposed in a slot or outer cavity 53 which extends around the inner part 32 and fluidically communicates with the pair of fluid recovery openings 50. In certain embodiments, nozzle 20 can comprise a plurality of porous members in various locations, as is described in further detail below. The porous member 51 may be a mesh or may be formed of a porous material having holes typically in the size range of about 50-200 microns. For example, the porous member 51 may be a wire mesh including woven pieces or layers of material made of metal, plastic, or the like, a porous metal, a porous glass, a porous plastic, a porous ceramic, or a sheet of material having chemically etched holes (e.g., by photo-etching). The outer part 30 further includes a fluid buffer outlet 56 and a fluid recovery outlet 58. In certain embodiments of the nozzle 20' as seen in FIG. 5, the inner part 32 does not contact or form a seal with the final optical element 22, but is spaced from the final optical element 22. The gap prevents nozzle vibrations from being transmitted to the final optical element 22. However, the gap may allow the fluid to be exposed to air.

One feature of the nozzle 20 is that it is made in two pieces, namely, the outer part 30 and the inner part 32. The inner part 32 keeps the fluid between the lens and the wafer surface, and the outer part 30 is mainly provided for fluid recovery. Vibration can be introduced during fluid recovery from the outer part 30 through the porous member 51 to the other components of the lithography system, including the inner part 32 which may be used to direct an autofocus beam to the wafer 16. A damping material can be mounted between the outer part 30 and the mounting piece to which the outer part 30 is mounted to minimize the transmission of vibration from the outer part 30. In addition, the outer part 30 that includes the porous member may be prone to contamination and thus needs to be replaced for maintenance. Making the outer part 30 as a separate part facilitates easier maintenance. It can also minimize readjustment and recalibration time after replacement of the outer part as opposed to replacing the entire nozzle 20. Manufacturability of the nozzle 20 can also be improved if the nozzle 20 is made in two separate parts. It is understood that the nozzle 20 may be made of a single piece in alternative examples.

In certain embodiments, the nozzle 20 can comprise a groove 48 between the inner part 32 and the outer part 30. This groove 48 functions as a breaking edge to prevent fluid in the inner part 30 from being drawn out by the porous member 51 on the outer part 30 if the fluid recovery rate is faster than the fluid supply rate. In the situation when there is no breaking edge, a balance between the fluid recovery rate and the fluid supply rate has to be maintained so that fluid can be kept within the inner part 32 at all times during scanning. Having the groove 48 allows the recovery rate to be set at a maximum to minimize fluid leakage out of the outer part 30 during scanning. The groove 48 also acts as a buffer for fluid to go in and out during scanning, minimizing immersion fluid supply and recovery requirements.

In the process of immersion lithography, a fluid is to be filled between the projection lens 14 and the wafer 16 from a dry state and, at other times, the fluid is to be recovered. For example, in the beginning of exposure of a new wafer, the fluid is to completely fill the inner cavity 34 of the inner part 32 before starting exposure. During this process, ideally no air bubbles can exist between the projection lens 14 and wafer 16 or other optical paths such as the auto focus beam. The fluid supply in the inner cavity of the inner part 32 is designed to be at the highest point in the cavity (via apertures 38) so that the fluid is filled from top down, allowing air bubbles to be pushed out of the inner cavity during the filling process. The fluid desirably is initially supplied from one side in this embodiment (the set of apertures 38 on one side), so that the fluid is filled from one side to the other, again allowing air bubbles to be pushed out to avoid trapping air therein. Other arrangements are also possible, as long as the fluid is being filled from the inside out.

On occasion, the fluid has to be fully recovered from the inner cavity of the inner part 32. In FIG. 4, there are small holes 42 in each of the buffers 40 in the inner cavity. These holes 42 are provided for fast fluid recovery or fluid purge when the fluid has to be fully recovered. Sucking the fluid out from these holes 42 using high vacuum with the combination of some movement in the wafer stage 18 allows all the fluid to be recovered within a reasonable time.

The inner part 32 has two groups or rows of holes 38 for supplying or recovering the fluid. Each row can be independently controlled to either supply or recover the fluid. In the case where both rows are chosen for fluid supply, all the fluid is recovered through the porous member 51 in the outer part 30. Since both rows are supplying fluid, a pressure can build up in the inner cavity causing deformation of the final optical element 22 of the projection lens 14 or the wafer 16 or both. The fluid flow across the final optical element 22 may also be limited, and thus the temperature of the fluid between the final optical element 22 and the wafer 16 may eventually rise, causing adverse effect. On the other hand, if one row is chosen for supply and the other for recovery, a fluid flow will be driven across the final optical element 22, minimizing temperature rise. It can also reduce the pressure otherwise created by supplying fluid from both rows. In this case, less fluid needs to be recovered through the porous member 51, lowering the fluid recovery requirement in the porous member. In other nozzle configurations, multiple fluid supplies and recoveries may be provided so as to optimize the performance.

During scanning motion of the wafer stage 18 (in the direction of scan 44 in FIG. 2), the fluid may be dragged in and out of the inner cavity of the inner part 32. When the fluid is dragged out, it is recovered through the porous member 51 in the outer part 30. When the wafer stage 18 is moved in the opposite direction, air may be dragged into the inner cavity of the inner part 32. During this time, the fluid in the buffers 40, as well as the fluid supplied from within the inner cavity, helps to refill the fluid that is dragged along the scanning direction, preventing air from getting into the inner cavity. The buffers 40 and the porous member 51 work together to minimize fluid leaking out from the outer part 30, and air dragging into the inner cavity of the inner part 32 during scanning motion of the wafer stage 18.

Figure 6:
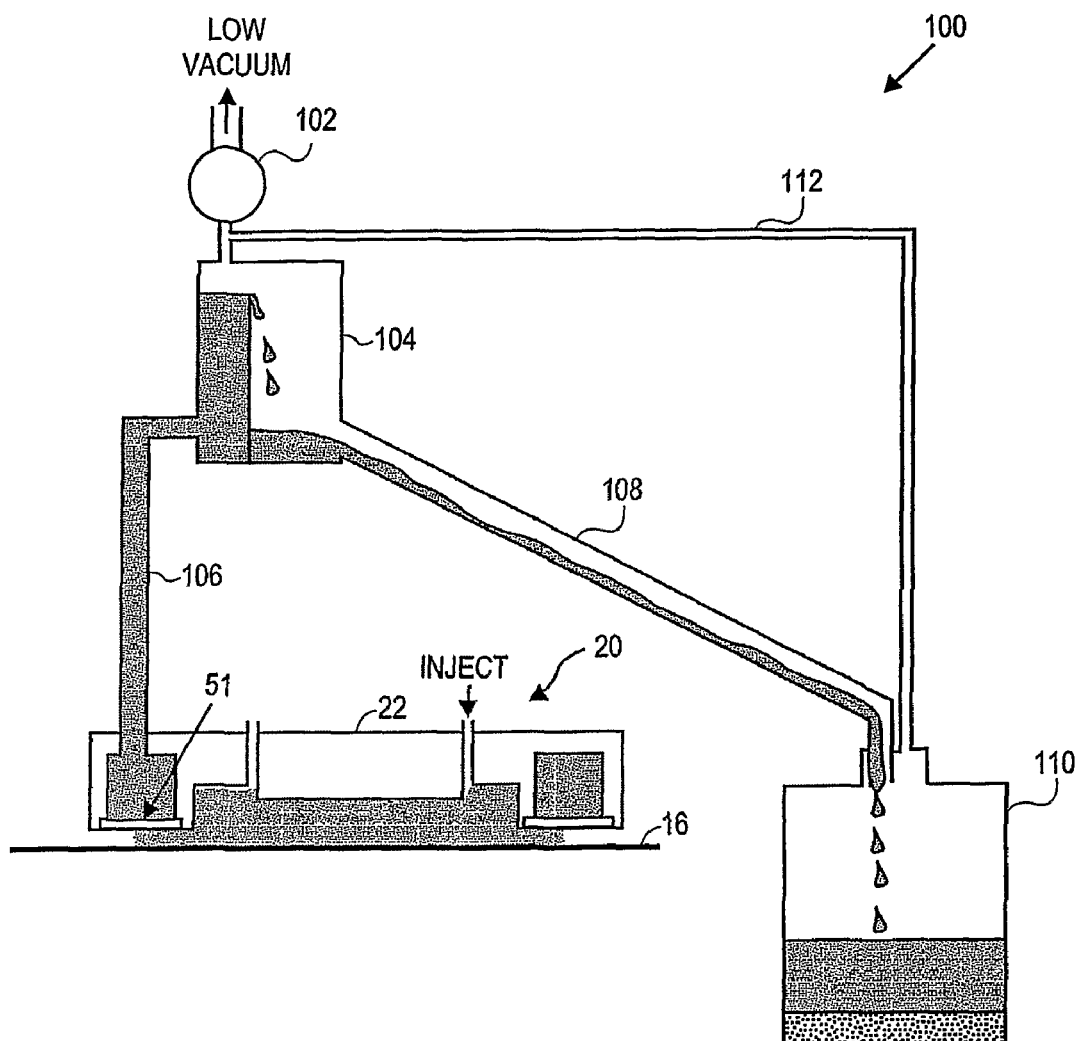
FIG. 6 is a simplified view schematically illustrating a pressure control system for fluid recovery in an immersion lithography system according to certain embodiments.
Figure 7:
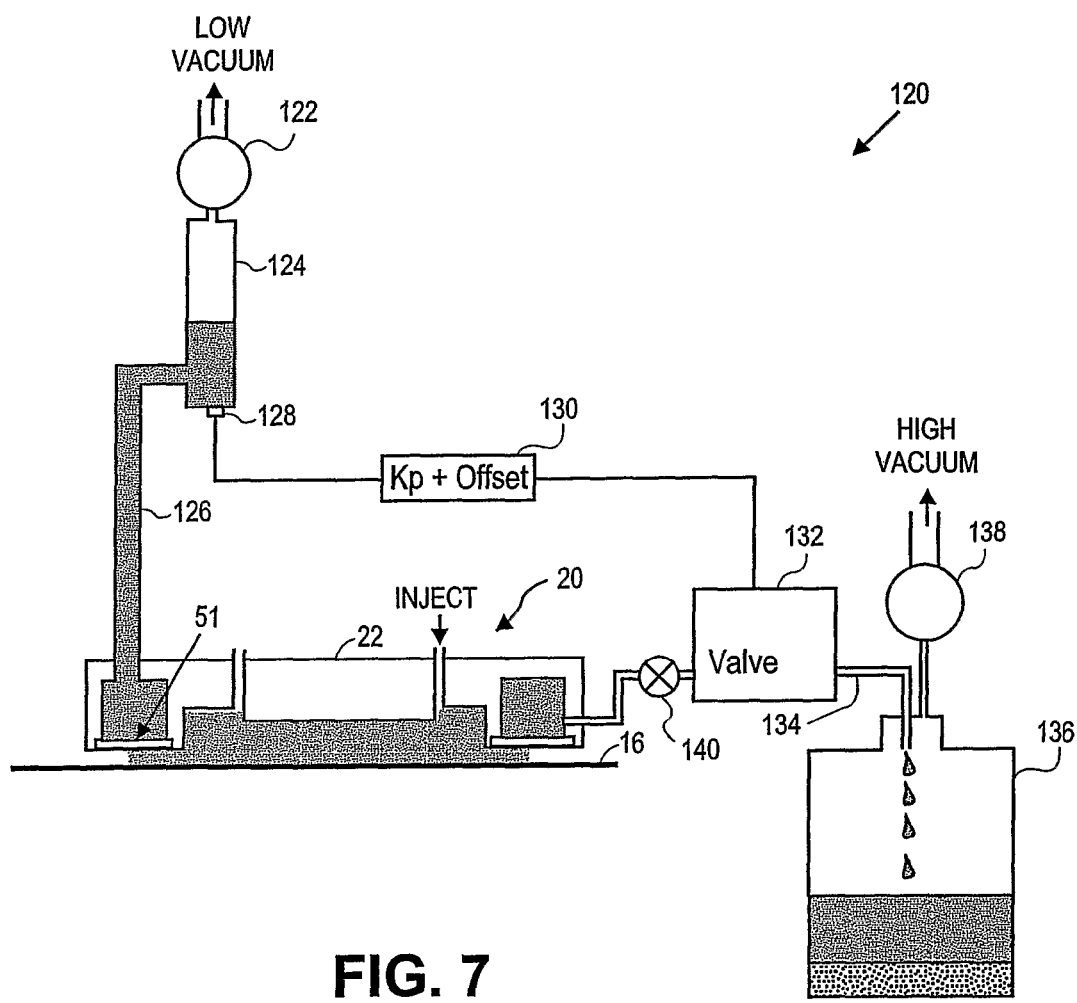
FIG. 7 is a simplified view schematically illustrating a pressure control system for fluid recovery in an immersion lithography system according to certain embodiments.

Recovering fluid through the porous member 51 by maintaining the pressure in the porous member 51 under the bubble point can eliminate noise and/or vibration created by mixing air with the fluid during fluid recovery. For example, in certain embodiments, by maintaining a negative pressure on the upper side of the wet porous member 51 in a predetermined pressure range, the gas (e.g., air) on the lower side of the wet porous member 51 can be prevented from passing through the wet porous member 51 while the immersion fluid on the lower side of the wet porous member 51 is recovered through the wet porous member 51. The bubble point is a characteristic of the porous member 51 which depends on the size of the holes in the porous member 51 (the largest hole) and the contact angle which the fluid forms with the porous member 51 (as a parameter based on the property of the porous material and the property of the fluid). Due to the fact that the bubble point is typically a very low pressure (e.g., about 1000 pascal), the control of this low pressure becomes an important issue. FIGS. 6 and 7 illustrate three specific ways of maintaining the pressure below the bubble point during fluid recovery.

In the pressure control system 100 of FIG. 6, a pressure under bubble point is maintained at the surface of the porous member 51 using a vacuum regulator 102 with the assistance of an overflow container or tank 104 fluidicly coupled to the porous member 51 by a recovery flow line 106 (which is connected to the fluid buffer outlet 56). The pressure at the surface of the porous member 51 is equal to the pressure maintained by the vacuum regulator 102 subtracting the pressure created by the height of the fluid above the porous member 51. Maintaining a constant height of fluid above the porous member 51 using the overflow tank 104 allows easy control of the pressure at the surface of the porous member 51. The fluid that is recovered through the porous member 51 will overflow and be siphoned down along a siphon line 108 to a collection tank 110, which is disposed below the overflow tank 104. An optional flow path 112 is connected between the overflow tank 104 and the collection tank 110 to assist in equalizing the pressure between the overflow tank 104 and the collection tank 110 and facilitate flow along the siphon line 108. One feature of this pressure control system 100 is that it is a passive system without the necessity of control.

In the pressure control system 120 of FIG. 7, the pressure at the surface of the porous member 51 is maintained below the bubble point using a vacuum regulator 122 at an immersion fluid level buffer 124 which is fluidically coupled with the porous member 51 by a buffer flow line 126 (which is connected to the fluid buffer outlet 56). A pressure transducer or an immersion fluid level sensor 128 is used to measure the pressure or fluid level at the fluid level buffer 124. The sensor signal is then used for feedback control 130 to a valve 132 that is disposed in a recovery flow line 134 (which is connected to the fluid recovery outlet 58) connected between the porous member 51 and a collection tank 136. The valve 132 may be any suitable valve, such as a proportional or variable valve.

The variable valve 132 is adjusted to control the fluid flow through the fluid recovery line 134 to the collection tank 136 to maintain the pressure or fluid level of the fluid level buffer 124 at a preset value. The collection tank 136 is under a relatively higher vacuum controlled by a high vacuum regulator 138 for fluid recovery. In this fluid control system 120, no overflow tank is needed and the collection tank 136 can be placed anywhere in the system and need not be disposed below an overflow tank. An on/off valve 140 is desirably provided in the fluid recovery line 134 and is switched off when fluid recovery is not required.

Figure 8:
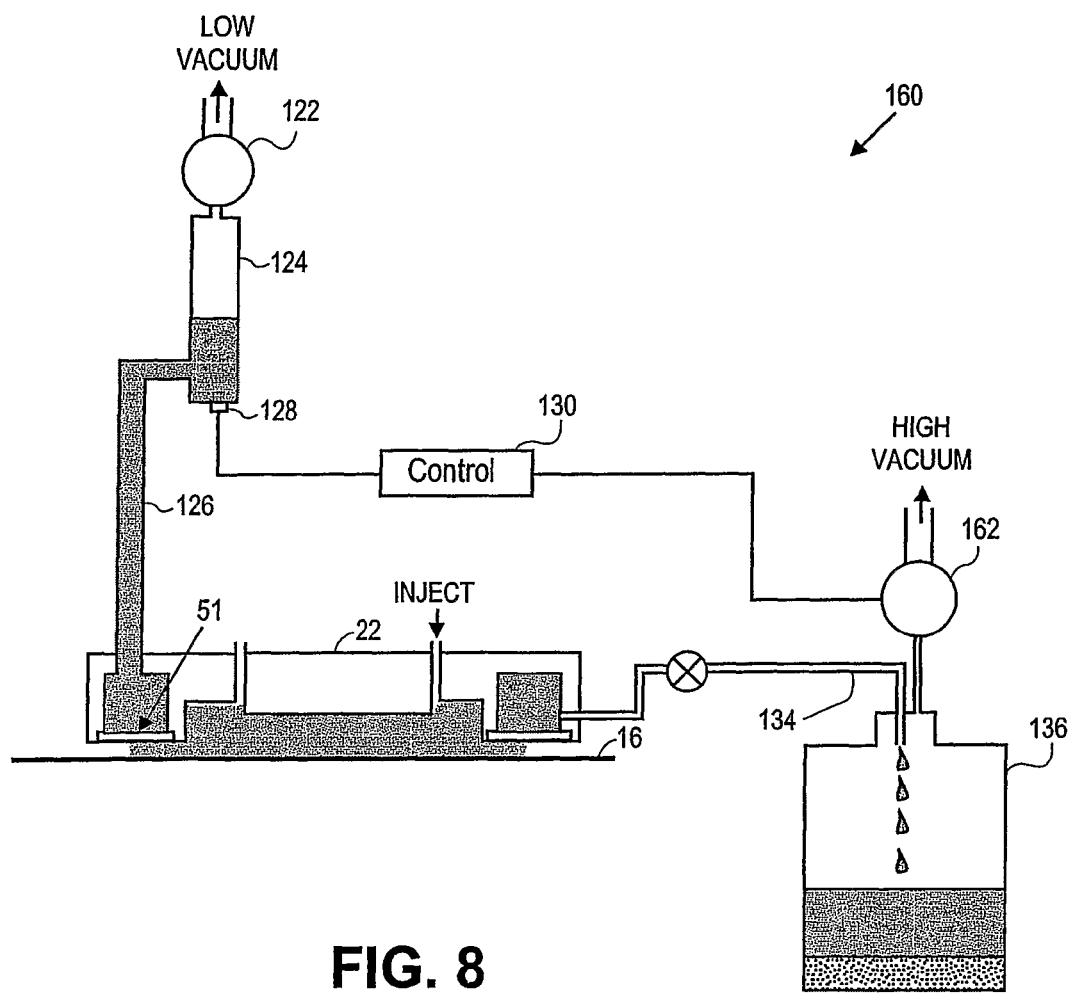
FIG. 8 is a simplified view schematically illustrating a pressure control system for fluid recovery in an immersion lithography system according to certain embodiments.

In FIG. 8, the pressure control system 160 is similar to the system 120 of FIG. 7, and like reference characters are used for like parts. Instead of using the valve 132 for the feedback control of fluid recovery, this system 160 employs a controllable vacuum regulator 162 for the feedback control of fluid recovery. The vacuum regulator 162 is typically electronically controllable to adjust the vacuum pressure in the collection tank 136 based on the sensor signal from the pressure transducer or an immersion fluid level sensor 128. The vacuum regulator 162 is adjusted to control the fluid flow through the fluid recovery line 134 to the collection tank 136 to maintain the pressure or fluid level of the fluid level buffer 124 at a preset value. The on/off valve 140 in the fluid recovery line 134 is switched off when fluid recovery is not required.

Figure 9:
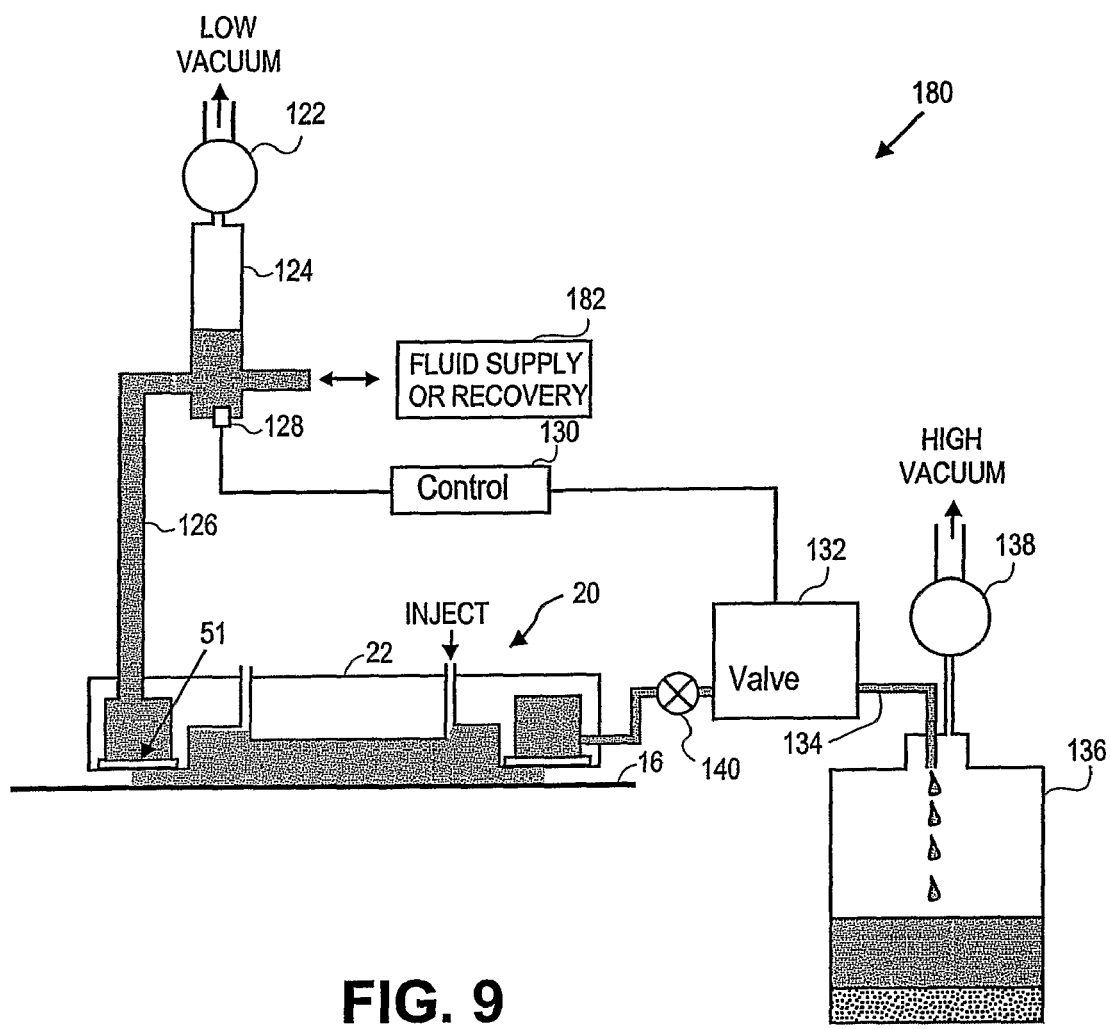
FIG. 9 is a simplified view schematically illustrating a pressure control system for fluid recovery in an immersion lithography system with immersion fluid stagnation prevention, according to certain embodiments.

FIG. 9 shows a pressure control system for fluid recovery in an immersion lithography system with immersion fluid stagnation prevention according to certain embodiments. The pressure control system 180 is similar to the system 120 of FIG. 7 having the same components with the same reference characters. In addition, the immersion fluid level buffer 124 is fluidically coupled with an immersion fluid supply or immersion fluid recovery 182 to supply immersion fluid to or recover immersion fluid from the immersion fluid level buffer 124 to prevent stagnation. An optional pump or a similar moving part may be used to induce flow between the immersion fluid level buffer 124 and the immersion fluid supply or immersion fluid recovery 182. There is a possibility of bacteria/fungus growth in stagnated immersion fluid over time. Under normal operation, the immersion fluid at the immersion fluid level buffer 124 is stagnated because immersion fluid recovered from the mesh 51 will go through the small tube at the mesh level to the collection tank 136. By inducing flow into or out of the immersion fluid level buffer 124 during normal operation, the bacteria/fungus growth problem can be prevented.

Figure 10:
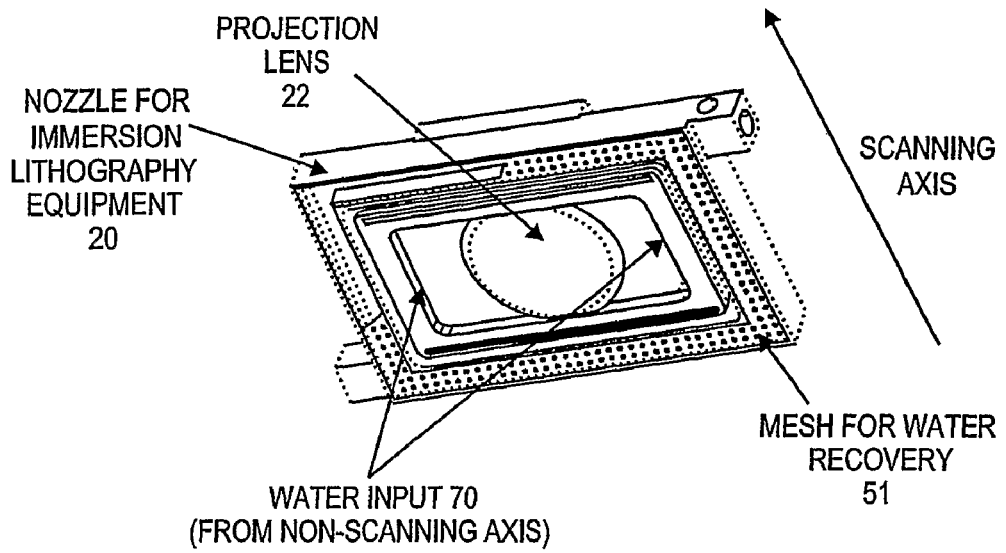
FIG. 10 is a perspective view of a nozzle for fluid delivery and recovery for immersion lithography where immersion fluid is injected on a non-scanning axis, according to certain embodiments.
Figure 11:
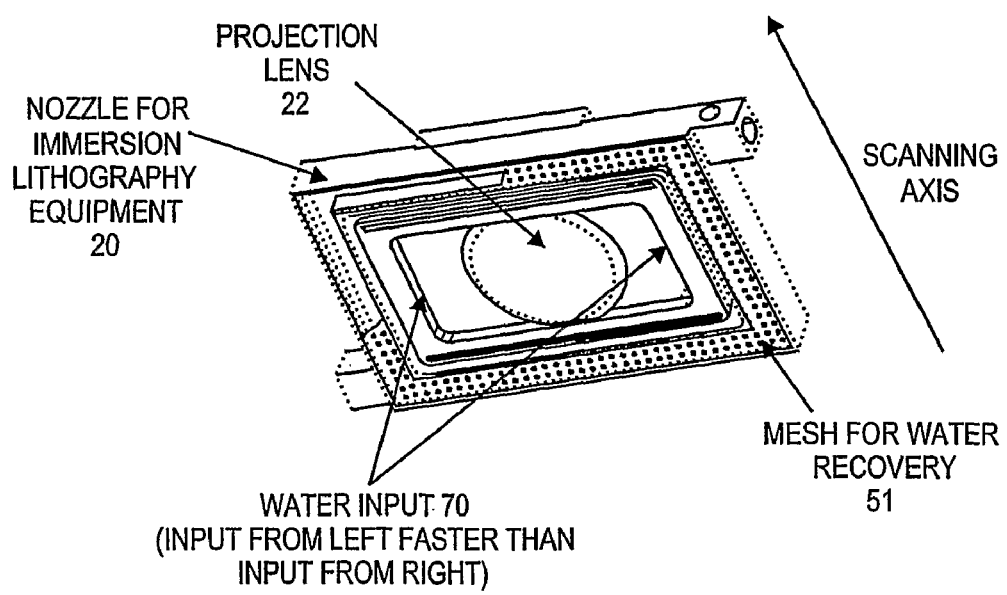
FIG. 11 is a perspective view of a nozzle for fluid delivery and recovery for immersion lithography where immersion fluid is input from a left side faster than immersion fluid is input from a right side, according to certain embodiments.

FIGS. 10 and 11 are exemplary perspective views of a nozzle 20 for fluid delivery and recovery for immersion lithography where immersion fluid is injected on a non-scanning axis and immersion fluid is input from a left side faster than from a right side, respectively. Referring to FIG. 10, nozzle 20 includes an immersion fluid input 70 that provides immersion fluid in a non-scanning axis direction. The scanning axis is the axis in which the nozzle 20 can move to perform the immersion lithography. The nozzle 20 can move in a positive (e.g., upward) or negative (e.g., downward) direction along the scanning axis. The immersion fluid input 70 are located laterally on opposite sides of the projection lens 22 and can run substantially parallel to the scanning axis direction. The immersion fluid input 70 includes one or more apertures or openings that allow immersion fluid to flow in and out of the inner cavity of the nozzle 20 under the projection lens 22.

As the nozzle 20 moves in either the positive or negative scanning axis directions, immersion fluid input 70 injects immersion fluid into the inner cavity in a non-scanning direction. In this example, the non-scanning axis direction can be substantially perpendicular or orthogonal to the scanning axis direction. In this manner, the immersion fluid flow under the projection lens 22 can be more consistent and uniformed as the nozzle 20 moves in the positive or negative directions. The immersion lithography process can thus be improved by the even flow of immersion fluid under the projection lens 22.

FIG. 11 illustrates certain embodiments of improving immersion lithography. The nozzle 20 is substantially similar to the one in FIG. 10, except that immersion fluid input 70 can input immersion fluid on one side at a faster rate than the opposite side. In particular, immersion fluid input 70 can inject immersion fluid in a non-scanning axis direction that can be perpendicular or orthogonal to the scanning axis direction. In other examples, the only requirement is that the directions are different. In the example of FIG. 11, the immersion fluid input 70 on the left side of the projecting lens 22 injects immersion fluid into the inner cavity at a faster rate than the immersion fluid input on the right side of the projection lens 22. Alternatively, the right side immersion fluid input 70 can also inject immersion fluid at a faster rate than the immersion fluid input on the left side. By injecting immersion fluid at different flow rates at opposite sides of the projection lens 22, the nozzle 20 can prevent air from being trapped in the inner cavity during the initial filling process of the nozzle 20.

The different flow rates in the inner cavity can also improve immersion fluid flow across the projection lens 22 during exposure that avoids raising immersion fluid temperature under the projection lens 22. For example, the different flow rates can prevent residue or left over immersion fluid from remaining in the inner cavity after exposure to light. When residue or left over immersion fluid remains, it can raise the immersion fluid temperature of newly injected immersion fluid into the inner cavity, which should be avoided during immersion lithography. Thus, the above examples of FIGS. 10 and 11 thus improve immersion lithography.

Figure 12:
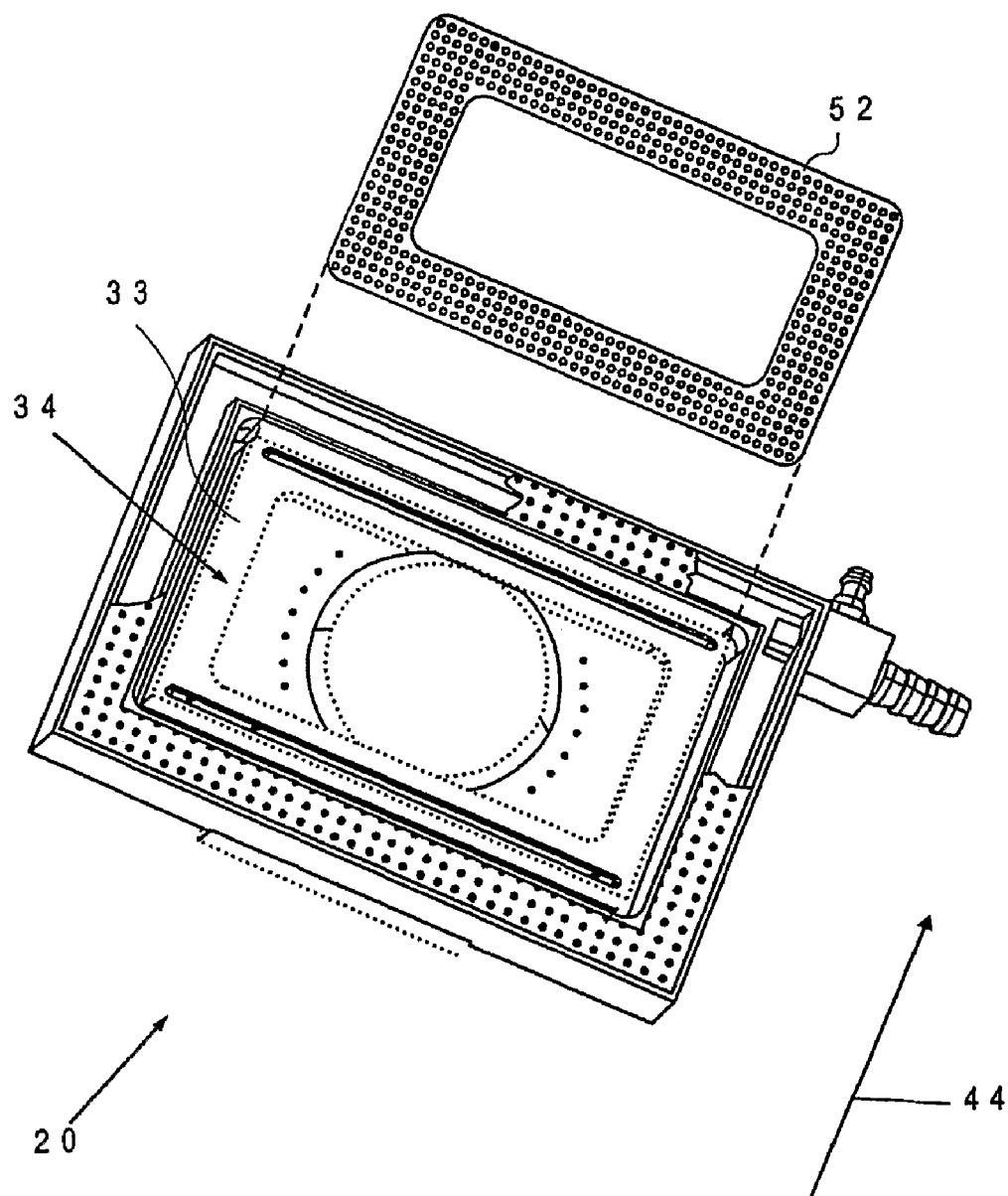
FIG. 12 is a perspective view of a nozzle for fluid delivery and recovery for immersion lithography including a porous member, according to certain embodiments.

In certain embodiments, as illustrated in FIG. 12, nozzle 20 can comprise a porous member 52. In certain embodiments, porous member 52 may be a mesh or may be formed of a porous material having holes typically in the size range of about 50-200 microns. For example, in certain embodiments, porous member 52 can be a wire mesh including woven pieces or layers of material made of metal, plastic, or the like, a porous metal, a porous glass, a porous plastic, a porous ceramic, or a sheet of material having chemically etched holes (e.g., by photo-etching). In certain embodiments, porous member 52 can be disposed at or near flat portion 33.

In certain embodiments, porous member 52 can facilitate immersion fluid removal from inner cavity 34. For example, during immersion fluid removal, applying a vacuum to porous member 52 can provide for a more evenly distributed vacuum across substantially all of porous member 52. In certain embodiments, the more evenly distributed vacuum across substantially all of porous member 52 can result in removal of immersion fluid at a faster rate. In certain embodiments, the use of a porous member (e.g., 52) can facilitate a more complete removal of immersion fluid from inner cavity 34.

In certain embodiments, the surface roughness of porous member 52 can affect the behavior of the immersion fluid in the inner cavity 34. For example, in certain embodiments, a change in the surface roughness of porous member 52 can reduce immersion fluid turbulence and can reduce the amount of air incorporated into the immersion fluid. In certain embodiments, this can result in a faster stage scanning speed since less air is introduced into the exposure area. In a similar manner, in certain embodiments, the nozzle filling behavior can be manipulated by a change in the surface roughness of porous member 52.

Figure 13:
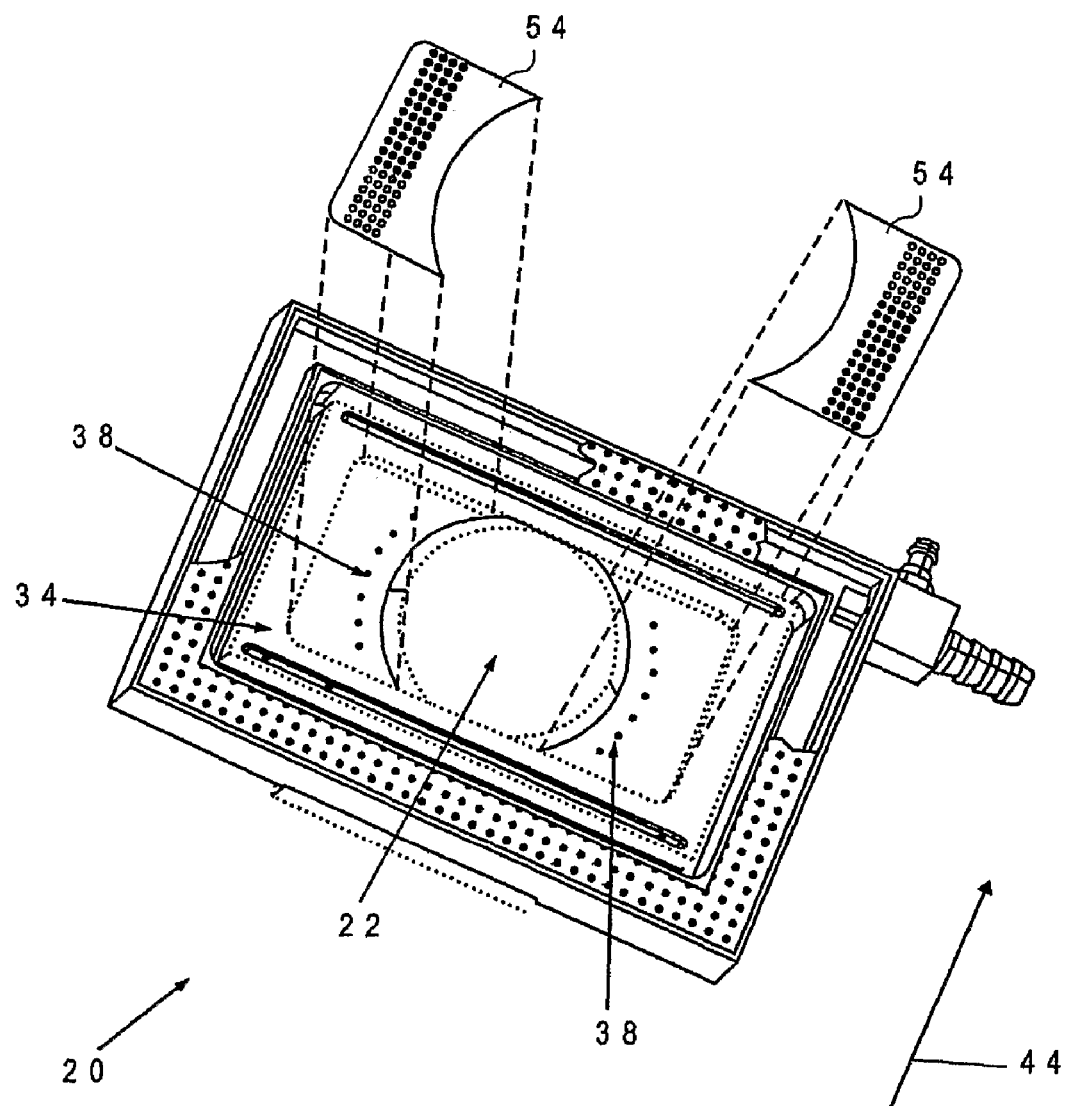
FIG. 13 is a perspective view of a nozzle for fluid delivery and recovery for immersion lithography including one or more porous members, according to certain embodiments.

In certain embodiments, as illustrated in FIG. 13, nozzle 20 can comprise one or more porous members 54. In certain embodiments, the one or more porous members 54 can be a mesh or can be formed of a porous material having holes typically in the size range of about 50-200 microns. For example, in certain embodiments, the one or more porous members 54 can comprise a wire mesh including woven pieces or layers of material made of metal, plastic, or the like, a porous metal, a porous glass, a porous plastic, a porous ceramic, or a sheet of material having chemically etched holes (e.g., by photo-etching). In certain embodiments, the one or more porous members 54 can be disposed at or near the apertures 38.

In certain embodiments, the one or more porous members 54 can reduce the turbulence associated with the immersion fluid entering the inner cavity 34. For example, in certain embodiments, immersion fluid entering the inner cavity 34 directly from the apertures 38 can cause turbulence in the immersion fluid, leading to the formation of additional air within the immersion fluid. As discussed above, this additional air can have an adverse effect upon the performance of the immersion lithography system. However, in certain embodiments, introducing immersion fluid into the inner cavity 34 through the one or more porous members 54 can reduce the turbulence generated at the immersion fluid inlet. This can result in more uniform immersion fluid flow into the inner cavity 34 which can lead to a higher stage scanning speed without introducing substantial air into the exposure area. In certain embodiments, two porous members 54 can be used on opposing sides of the final optical element 22. In certain embodiments, one porous member 54 can be used on one side of the final optical element 22.

Additionally, the above examples can be applied to Twin-Stage-Type Lithography System. Twin-Stage-Type Lithography System, for example, is disclosed in U.S. Pat. Nos. 6,262, 796 and 6,341,007, the entire disclosures of which are incorporated herein by reference.

Thus, an apparatus and method for providing fluid for immersion lithography have been described. Furthermore, the above description are intended to be illustrative and not restrictive. Many other examples will be apparent upon reviewing the above examples. The scope of the invention should, therefore, be determined not with reference to the above examples, but instead should be determined with reference to the appended claims along with their full scope of equivalents.

What is claimed is:

1. A method for immersion lithography comprising:
   injecting immersion liquid into an inner cavity of a nozzle in a direction that crosses an axis along which a substrate and the nozzle are relatively moved during exposure of a light pattern onto an exposure area on the substrate, the nozzle including a body that encircles the exposure area, the inner cavity encircling the exposure area and comprising a recess in a side of the body that faces the substrate during the exposure; and
   exposing the light pattern through the immersion liquid onto the substrate covered with photoresist during the exposure.

2. The method of claim 1, further comprising:
   relatively moving the substrate and the nozzle in a scanning axis direction during the exposure; and
   injecting the immersion liquid in a non-scanning axis direction during the exposure.

3. The method of claim 2, wherein the injecting the immersion liquid in the non-scanning axis direction includes injecting the immersion liquid in a substantially perpendicular or orthogonal direction to the scanning axis direction.

4. The method of claim 2, wherein the substrate and the nozzle are relatively moved in a positive and negative scanning axis direction.

5. The method of claim 1, wherein the injecting immersion liquid into the cavity includes simultaneously injecting the immersion liquid into the cavity on opposite sides of a projection lens.

6. The method of claim 1, wherein the nozzle includes a porous member substantially adjacent to a flat portion of the body that is located within the inner cavity, the porous member including a plurality of holes.

7. The method of claim 1, wherein the nozzle includes one or more porous members substantially adjacent to an immersion liquid input that is located within the inner cavity, each of the one or more porous members including a plurality of holes.

8. A nozzle for immersion lithography comprising:
   a body that encircles a final optical element of a projection system by which a light pattern is projected onto a substrate during exposure of the substrate, the body including an inner cavity that holds immersion liquid during the exposure of the substrate, the inner cavity comprising a recess in a side of the body that faces the substrate during the exposure; and
   an immersion liquid input that, during the exposure of the substrate, injects the immersion liquid into the inner cavity in a direction that crosses an axis along which the substrate and the nozzle are relatively moved during the exposure of the substrate.

9. The nozzle of claim 8, wherein the substrate and the nozzle are relatively moved in a scanning axis direction and the immersion liquid input injects the immersion liquid in a non-scanning axis direction.

10. The nozzle of claim 9, wherein the immersion liquid input injects the immersion liquid in a substantially perpendicular or orthogonal direction to the scanning axis direction.

11. The nozzle of claim 9, wherein the substrate and the nozzle are relatively moved in a positive and negative scanning axis direction.

12. The nozzle of claim 8, wherein the immersion liquid input includes openings on opposite sides of the inner cavity for simultaneously injecting the immersion liquid in the non-scanning axis direction from the opposite sides of the inner cavity.

13. The nozzle of claim 8, further comprising a porous member located substantially adjacent to a flat portion of the body, wherein the flat portion is located within the inner cavity, and the porous member includes a plurality of holes.

14. The nozzle of claim 8, further comprising one or more porous members located substantially adjacent to the immersion liquid input, each of the one or more porous members including a plurality of holes.

15. A method for immersion lithography comprising:
   injecting immersion liquid at a first rate into a cavity;
   injecting the immersion liquid at a second rate into the cavity, the second rate being different than the first rate, both injecting steps occurring simultaneously, the immersion liquid injected at the first rate being directed in a first direction that is different from a second direction in which the immersion liquid injected at the second rate is directed; and
   exposing light through the immersion liquid in the cavity onto a substrate covered with photoresist while the immersion liquid is being injected at the first and second rates in the first and second directions.

16. The method of claim 15, wherein the first rate is faster than the second rate.

17. The method of claim 15, wherein the second rate is faster than the first rate.

18. The method of claim 15, further comprising:
injecting the immersion liquid at the first rate and second rate at opposite sides of the cavity.

19. The method of claim 15, wherein the injecting immersion liquid at the first rate further comprises passing the immersion liquid through a porous member into the cavity, the porous member including a plurality of holes.

20. The method of claim 15, wherein the injecting immersion liquid at the second rate further comprises passing the immersion liquid through a porous member into the cavity, the porous member including a plurality of holes.

21. A nozzle for immersion lithography comprising:
a body that encircles a final optical element of a projection system by which a light pattern is projected onto a substrate during exposure of the substrate, the body including a cavity that holds immersion liquid during the exposure of the substrate, the cavity comprising a recess in a side of the body that faces the substrate during the exposure;
a first input in the body to inject the immersion liquid at a first rate into the cavity; and
a second input in the body to inject the immersion liquid at a second rate into the cavity, the second rate being different than the first rate, the first and second inputs injecting the immersion liquid simultaneously during the exposure, the immersion liquid injected at the first rate being directed in a first direction that is different from a second direction in which the immersion liquid injected at the second rate is directed.

22. The nozzle of claim 21, wherein the first rate is faster than the second rate.

23. The nozzle of claim 21, wherein the second rate is faster than the first rate.

24. The nozzle of claim 21, wherein the first input and the second input are located at opposite sides of an opening in the body through which the light pattern is projected by the final optical element.

25. The nozzle of claim 21, further comprising a porous member substantially adjacent to the first input, the porous member including a plurality of holes.

26. The nozzle of claim 21, further comprising a porous member substantially adjacent to the second input, the porous member including a plurality of holes.

27. The nozzle of claim 21, further comprising a porous member substantially adjacent to a flat portion of the body, wherein the flat portion is located within the cavity, the porous member including a plurality of holes.

28. A method for immersion lithography comprising:
simultaneously injecting immersion liquid into an inner cavity of a nozzle at a first side of the inner cavity and at a second side of the inner cavity, the injecting immersion liquid being in a direction that crosses an axis along which a substrate and the nozzle are relatively moved during exposure of the substrate to a light pattern, the immersion liquid being injected from the first side of the inner cavity having a flow rate that is different from the immersion liquid being injected from the second side of the inner cavity, the nozzle including a body that encircles an exposure area onto which the light pattern is exposed, the inner cavity encircling the exposure area and comprising a recess in a side of the body that faces the substrate during the exposure; and
exposing the light pattern through the immersion liquid onto the substrate covered with photoresist during the exposure while the immersion liquid is being simultaneously injected at the first and second sides of the inner cavity.

29. The method of claim 28, further comprising:
relatively moving the substrate and the nozzle in a scanning axis direction during the exposure; and
injecting the immersion liquid in a non-scanning axis direction.

30. The method of claim 29, wherein injecting the immersion liquid in the non-scanning axis direction includes injecting the immersion liquid in a substantially perpendicular direction to the scanning axis direction.

31. The method of claim 29, wherein the nozzle and the substrate are alternatively moved in a positive and a negative scanning axis direction.

32. The method of claim 28, wherein the first and second sides of the inner cavity are on opposite sides of the exposure area.

33. The method of claim 28, wherein the first flow rate is faster than the second flow rate.

34. The method of claim 28, wherein the second flow rate is faster than the first flow rate.

35. The method of claim 28, wherein the injecting immersion liquid into the inner cavity of the nozzle at the first side of the inner cavity causes at least a portion of the immersion liquid to pass through a porous member that includes a plurality of holes.

36. The method of claim 28, wherein the injecting immersion liquid into the inner cavity of the nozzle at the second side of the inner cavity causes at least a portion of the immersion liquid to pass through a porous member that includes a plurality of holes.

37. An apparatus comprising:
a nozzle including a body that encircles a final optical element of a projection system by which a light pattern is projected onto a substrate during exposure of the substrate, the body including an inner cavity that holds immersion liquid during the exposure of the substrate, the inner cavity comprising a recess in a side of the body that faces the substrate during the exposure;
a first input at a first side of the inner cavity injecting the immersion liquid into the inner cavity at a first direction and a first rate during the exposure;
a second input at a second side of the inner cavity injecting the immersion liquid into the inner cavity at a second direction and a second rate during the exposure, wherein the first rate is different than the second rate and the first and second directions are different from each other and cross a scanning axis direction in which a substrate and the apparatus are relatively moved during exposure of the substrate.

38. The apparatus of claim 37, wherein the first and second inputs inject the immersion liquid in a non-scanning axis direction.

39. The apparatus of claim 38, wherein the first and second inputs inject the immersion liquid in a substantially perpendicular or orthogonal direction to the scanning axis direction.

40. The apparatus of claim 37, wherein the first and second inputs are located on opposite sides of an opening in the body through which the light pattern is projected by the final optical element.

41. The apparatus of claim 37, wherein the first rate is faster than the second rate.

42. The apparatus of claim 37, wherein the second rate is faster than the first rate.

43. The apparatus of claim 37, further comprising a porous member substantially adjacent to the first input, the porous member including a plurality of holes.

44. The apparatus of claim 37, further comprising a porous member substantially adjacent to the second input, the porous member including a plurality of holes.

45. The apparatus of claim 37, further comprising a porous member substantially adjacent to a flat portion of the body, wherein the flat portion is located within the inner cavity, and the porous member includes a plurality of holes.

46. A nozzle for immersion lithography, comprising:
an inner body that comprises an inner cavity that holds immersion liquid, the inner body encircles a final optical element of a projection system by which a light pattern is projected onto a substrate during exposure of the substrate, the inner cavity comprising a recess in a side of the inner body that faces the substrate during the exposure;
the inner body further comprising a flat portion that encircles the inner cavity;
a buffer located on at least a portion of the flat portion;
wherein the buffer is configured to allow the immersion liquid to flow into or out of, or into and out of, the inner cavity; and
a porous member adjacent to at least a portion of the buffer, the porous member having a plurality of holes.

47. The nozzle of claim 46, further comprising a vacuum applied to at least a portion of the porous member.

48. The nozzle of claim 46, wherein the porous member is a mesh.

49. The nozzle of claim 48, wherein the plurality of holes have a diameter that is not smaller than 50 microns and is not greater than 200 microns.

50. The nozzle of claim 46, further comprising an immersion liquid input that injects the immersion liquid into the inner cavity during the exposure in a direction that crosses an axis along which the substrate and the nozzle are relatively moved during the exposure of the substrate.

51. The nozzle of claim 46, further comprising:
a first input in the inner body to inject the immersion liquid at a first rate into the inner cavity; and
a second input in the inner body to simultaneously inject the immersion liquid at a second rate into the inner cavity, the second rate being different than the first rate.

52. A nozzle for immersion lithography, comprising:
an inner body that comprises an inner cavity that holds immersion liquid, the inner body encircles a final optical element of a projection system by which a light pattern is projected onto a substrate during exposure of the substrate, the inner cavity comprising a recess in a side of the inner body that faces the substrate during the exposure;
the inner body further comprising an immersion liquid input disposed in the inner cavity;
a second input disposed in the inner cavity to inject the immersion liquid at a second rate into the inner cavity; and
a porous member disposed adjacent to the immersion liquid input, the porous member including a plurality of holes,
wherein the immersion liquid input injects the immersion liquid at a first rate into the inner cavity, the second rate being different than the first rate.

53. The nozzle of claim 52, wherein the porous member reduces an amount of turbulence introduced by the immersion liquid input.

54. The nozzle of claim 52, wherein the porous member is a mesh.

55. The nozzle of claim 54, wherein the plurality of holes have a diameter that is not smaller than 50 microns and is not greater than 200 microns.

56. The nozzle of claim 52, wherein the immersion liquid input injects the immersion liquid into the inner cavity during the exposure in a direction that crosses an axis along which the substrate and the nozzle are relatively moved during the exposure of the substrate.

* * * * *